(12) United States Patent
Tsang et al.

(10) Patent No.: US 6,393,598 B1
(45) Date of Patent: *May 21, 2002

(54) BRANCH METRIC COMPENSATION FOR DIGITAL SEQUENCE DETECTION

(75) Inventors: Kinhing P. Tsang, Plymouth; Robert E. Kost, Minneapolis; Kenneth R. Burns, Bloomington, all of MN (US)

(73) Assignee: Seagate Technology LLC, Scotts Valley, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/454,261

(22) PCT Filed: Apr. 20, 1995

(86) PCT No.: PCT/US95/04664

§ 371 Date: Jun. 1, 1995

§ 102(e) Date: Jun. 1, 1995

(87) PCT Pub. No.: WO96/33491

PCT Pub. Date: Oct. 24, 1996

(51) Int. Cl.[7] ............................................. G11B 20/18
(52) U.S. Cl. ........................................ 714/795; 360/40
(58) Field of Search ............................... 371/43.6, 43.7; 360/40; 714/794, 795

(56) References Cited

U.S. PATENT DOCUMENTS

| | | | |
|---|---|---|---|
| 4,777,636 A | 10/1988 | Yamashita et al. | 371/43 |
| 4,788,694 A | 11/1988 | Calderbank | 375/59 |
| 4,847,871 A | 7/1989 | Matsushita et al. | 375/94 |
| 4,979,175 A | 12/1990 | Porter | 371/43 |
| 5,111,483 A | 5/1992 | Serfaty | 375/94 |
| 5,131,011 A | 7/1992 | Bergmans et al. | 371/37.8 |
| 5,162,797 A | 11/1992 | Murata et al. | 341/107 |
| 5,220,570 A | 6/1993 | Lou et al. | 371/43 |

(List continued on next page.)

FOREIGN PATENT DOCUMENTS

| | | |
|---|---|---|
| JP | A-06097769 | 7/1994 |
| WO | WO-A-94/00843 | 6/1994 |
| WO | WO-A-94/29989 | 12/1994 |

OTHER PUBLICATIONS

Fitzpatrick, "A Maximum Likelihood Detector for Nonlinear Magnetic Recording", IEEE Transactions on Magnetics, vol. 27, No. 6, Nov. 1991, pp. 4816–4818.*

Lee et al., "Modified Maximum Likelihood Sequence Estimation in a Simple Partial Erasure Model", ICC '94 Conf. Rec., May 1–5, 1994, pp. 245–249, Apr. 1994.*

(List continued on next page.)

Primary Examiner—Stephen M. Baker
(74) Attorney, Agent, or Firm—Shawn Dempster; Jennifer Buenzow; Kirk Cesari

(57) ABSTRACT

The present invention provides sequence detection which takes into account amplitude and/or time distortions caused by neighboring magnetization regions on the magnetic medium, wherein the distortions in one magnetization region are caused by the closeness of neighboring magnetization transitions on one or both sides thereof. The sequence detection according to the present invention provides an extended state diagram to include the effects of leading and/or trailing magnetization transitions. More particularly, it has been found that accounting for the effects of trailing transitions requires an increase in the number of states in the state diagram used to form the Viterbi detector. Leading transitions are neutralized by increasing the number of branches between states in the Viterbi detector. Increasing the number of branches instead of states keeps the complexity low and thus saves hardware and associated costs.

21 Claims, 11 Drawing Sheets

U.S. PATENT DOCUMENTS

| | | | | |
|---|---|---|---|---|
| 5,291,499 A | * | 3/1994 | Behrens et al. | 371/43 |
| 5,291,524 A | | 3/1994 | Itakura et al. | 375/94 |
| 5,295,142 A | | 3/1994 | Hatakeyama | 371/43 |
| 5,327,440 A | * | 7/1994 | Fredrickson et al. | 371/43 |
| 5,341,387 A | | 8/1994 | Nguyen | 371/45 |
| 5,345,342 A | | 9/1994 | Abbott et al. | 360/48 |
| 5,357,524 A | | 10/1994 | Shimpuku et al. | 371/30 |
| 5,588,011 A | * | 12/1996 | Riggle | 371/43 |

OTHER PUBLICATIONS

Barndt et al., "Modeling and Signal Processing for the Nonlinear Thin Film Recording Channel", IEEE Transactions on Magnetics, vol. 28, No. 5, Sep. 1992, pp. 2710–2712.*

Shung et al., "Area–Efficient Architectures for the Viterbi Algorithm—Part II: Applications", IEEE Transactions on Communications, vol. 41, No. 5, May 1993, pp. 802–807.*

Lin et al., "Post Compensation for Nonlinear Distortions in PRML Recording Channel", IEEE Transactions on Magnetics, vol. 31, No. 6, Nov. 1995, pp. 3033–3035.*

Eleftheriou et al., "Improving Performance of PRML/EPRML through Noise Prediction", IEEE Transactions on Magnetics, vol. 32, No. 5, Sep. 1996, pp. 3968–3970.*

Altekar et al., "Improvements in Detectors Based on Colored Noise", IEEE Transactions on Magnetics, vol. 34, No. 1, Jan. 1998, pp. 94–97.*

Coker et al., "Noise–Predictive Maximum Likelihood (NPML) Detection", IEEE Transactions on Magnetics, vol. 34, No. 1, Jan. 1998, pp. 110–117.*

Lee et al., "Performance Comparison of Receivers in a Simple Partial Erasure Model", IEEE Transactions on Magnetics, vol. 30, No. 4, pp. 1465–1469, Jul. 1994.*

Siegel and Wolf, "Modulation and Coding for Information Storage", IEEE Communications Magazine, Dec. 1991.

"Sequential Projection Decoding for Class IV Partial Response Channels", IBM Technical Disclosure Bulletin, Dec. 1989, Vo. 32, No. 7, pp. 428–431.

* cited by examiner

PARTIAL RESPONSE CLASS 4 WITH $1-D^2$ PRECODER

| $A_k$ | State | $B_{k-2}$ | $B_{k-1}$ | $B_k$ | $Y_k$ | Next State | Branch |
|---|---|---|---|---|---|---|---|
| 0 | S0 | 0 | 0 | 0 | 0 | (00) S0 | A |
| 1 | S0 | 0 | 0 | 1 | +1 | (01) S1 | B |
| 0 | S1 | 0 | 1 | 0 | 0 | (10) S2 | C |
| 1 | S1 | 0 | 1 | 1 | +1 | (11) S3 | D |
| 1 | S2 | 1 | 0 | 0 | -1 | (00) S0 | E |
| 0 | S2 | 1 | 0 | 1 | 0 | (01) S1 | F |
| 1 | S3 | 1 | 1 | 0 | -1 | (10) S2 | G |
| 0 | S3 | 1 | 1 | 1 | 0 | (11) S3 | H |

FIGURE 2A
(PRIOR ART)

PARTIAL RESPONSE CLASS 4 WITH $1-D^2$ PRECODER
(with the addition of one trailing symbol)

| $A_k$ | $A_{k+1}$ | State | $B_{k-2}$ | $B_{k-1}$ | $B_k$ | $B_{k+1}$ | $Y_k$ | Next State | Branch |
|---|---|---|---|---|---|---|---|---|---|
| 0 | 0 | S0 | 0 | 0 | 0 | 0 | 0 | (000) S0 | AA |
| 0 | 1 | S0 | 0 | 0 | 0 | 1 | 0 | (001) S1 | AB |
| 1 | 0 | S1 | 0 | 0 | 1 | 0 | +1 | (010) S2 | BA |
| 1 | 1 | S1 | 0 | 0 | 1 | 1 | +1 | (011) S3 | BB |
| 0 | 1 | S2 | 0 | 1 | 0 | 0 | 0 | (100) S4 | CB |
| 0 | 0 | S2 | 0 | 1 | 0 | 1 | 0 | (101) S5 | CA |
| 1 | 1 | S3 | 0 | 1 | 1 | 0 | +1 | (110) S6 | DB |
| 1 | 0 | S3 | 0 | 1 | 1 | 1 | +1 | (111) S7 | DA |
| 1 | 0 | S4 | 1 | 0 | 0 | 0 | -1 | (000) S0 | EA |
| 1 | 1 | S4 | 1 | 0 | 0 | 1 | -1 | (001) S1 | EB |
| 0 | 0 | S5 | 1 | 0 | 1 | 0 | 0 | (010) S2 | FA |
| 0 | 1 | S5 | 1 | 0 | 1 | 1 | 0 | (011) S3 | FB |
| 1 | 1 | S6 | 1 | 1 | 0 | 0 | -1 | (100) S4 | GB |
| 1 | 0 | S6 | 1 | 1 | 0 | 1 | -1 | (101) S5 | GA |
| 0 | 1 | S7 | 1 | 1 | 1 | 0 | 0 | (110) S6 | HB |
| 0 | 0 | S7 | 1 | 1 | 1 | 1 | 0 | (111) S7 | HA |

FIGURE 3A

PARTIAL RESPONSE CLASS 4 WITH 1-D² PRECODER
(with the addition of one leading and one trailing symbol)

| $A_{k-1}$ | $A_k$ | $A_{k+1}$ | State | $B_{k-3}$ | $B_{k-2}$ | $B_{k-1}$ | $B_k$ | $B_{k+1}$ | $Y_k$ | Next State | Branch |
|---|---|---|---|---|---|---|---|---|---|---|---|
| 0 | 0 | 0 | S0 | 0 | 0 | 0 | 0 | 0 | 0 | (000) S0 | AA0 |
| 1 | 0 | 0 | S0 | 1 | 0 | 0 | 0 | 0 | 0 | (000) S0 | AA1 |
| 0 | 0 | 1 | S0 | 0 | 0 | 0 | 0 | 1 | 0 | (001) S1 | AB0 |
| 1 | 0 | 1 | S0 | 1 | 0 | 0 | 0 | 1 | 0 | (001) S1 | AB1 |
| 0 | 1 | 0 | S1 | 0 | 0 | 0 | 1 | 0 | +1 | (010) S2 | BA0 |
| 1 | 1 | 0 | S1 | 1 | 0 | 0 | 1 | 0 | +1 | (010) S2 | BA1 |
| 0 | 1 | 1 | S1 | 0 | 0 | 0 | 1 | 1 | +1 | (011) S3 | BB0 |
| 1 | 1 | 1 | S1 | 1 | 0 | 0 | 1 | 1 | +1 | (011) S3 | BB1 |

FIGURE 4A

| $A_{k-1}$ | $A_k$ | $A_{k+1}$ | State | $B_{k-3}$ | $B_{k-2}$ | $B_{k-1}$ | $B_k$ | $B_{k+1}$ | $Y_k$ | Next State | Branch |
|---|---|---|---|---|---|---|---|---|---|---|---|
| 1 | 0 | 1 | S2 | 0 | 0 | 1 | 0 | 0 | 0 | (100) S4 | CB1 |
| 0 | 0 | 1 | S2 | 1 | 0 | 1 | 0 | 0 | 0 | (100) S4 | CB0 |
| 1 | 0 | 0 | S2 | 0 | 0 | 1 | 0 | 1 | 0 | (101) S5 | CA1 |
| 0 | 0 | 0 | S2 | 1 | 0 | 1 | 0 | 1 | 0 | (101) S5 | CA0 |
| 1 | 1 | 1 | S3 | 0 | 0 | 1 | 1 | 0 | +1 | (110) S6 | DB1 |
| 0 | 1 | 1 | S3 | 1 | 0 | 1 | 1 | 0 | +1 | (110) S6 | DB0 |
| 1 | 1 | 0 | S3 | 0 | 0 | 1 | 1 | 1 | +1 | (111) S7 | DA1 |
| 0 | 1 | 0 | S3 | 1 | 0 | 1 | 1 | 1 | +1 | (111) S7 | DA0 |

FIGURE 4B

| $A_{k-1}$ | $A_k$ | $A_{k+1}$ | State | $B_{k-3}$ | $B_{k-2}$ | $B_{k-1}$ | $B_k$ | $B_{k+1}$ | $Y_k$ | Next State | Branch |
|---|---|---|---|---|---|---|---|---|---|---|---|
| 0 | 1 | 0 | S4 | 0 | 1 | 0 | 0 | 0 | -1 | (000) S0 | EA0 |
| 1 | 1 | 0 | S4 | 1 | 1 | 0 | 0 | 0 | -1 | (000) S0 | EA1 |
| 0 | 1 | 1 | S4 | 0 | 1 | 0 | 0 | 1 | -1 | (001) S1 | EB0 |
| 1 | 1 | 1 | S4 | 1 | 1 | 0 | 0 | 1 | -1 | (001) S1 | EB1 |
| 0 | 0 | 0 | S5 | 0 | 1 | 0 | 1 | 0 | 0 | (010) S2 | FA0 |
| 1 | 0 | 0 | S5 | 1 | 1 | 0 | 1 | 0 | 0 | (010) S2 | FA1 |
| 0 | 0 | 1 | S5 | 0 | 1 | 0 | 1 | 1 | 0 | (011) S3 | FB0 |
| 1 | 0 | 1 | S5 | 1 | 1 | 0 | 1 | 1 | 0 | (011) S3 | FB1 |

FIGURE 4C

| $A_{k-1}$ | $A_k$ | $A_{k+1}$ | State | $B_{k-3}$ | $B_{k-2}$ | $B_{k-1}$ | $B_k$ | $B_{k+1}$ | $Y_k$ | Next State | Branch |
|---|---|---|---|---|---|---|---|---|---|---|---|
| 1 | 1 | 1 | S6 | 0 | 1 | 1 | 0 | 0 | -1 | (100) S4 | GB1 |
| 0 | 1 | 1 | S6 | 1 | 1 | 1 | 0 | 0 | -1 | (100) S4 | GB0 |
| 1 | 1 | 0 | S6 | 0 | 1 | 1 | 0 | 1 | -1 | (101) S5 | GA1 |
| 0 | 1 | 0 | S6 | 1 | 1 | 1 | 0 | 1 | -1 | (101) S5 | GA0 |
| 1 | 0 | 1 | S7 | 0 | 1 | 1 | 1 | 0 | 0 | (110) S6 | HB1 |
| 0 | 0 | 1 | S7 | 1 | 1 | 1 | 1 | 0 | 0 | (110) S6 | HB0 |
| 1 | 0 | 0 | S7 | 0 | 1 | 1 | 1 | 1 | 0 | (111) S7 | HA1 |
| 0 | 0 | 0 | S7 | 1 | 1 | 1 | 1 | 1 | 0 | (111) S7 | HA0 |

FIGURE 4D

BRANCH METRIC COMPENSATION FOR DIGITAL SEQUENCE DETECTION

BACKGROUND OF THE INVENTION

The present invention relates in general to information storage and retrieval systems, and more particularly, to a method and apparatus for providing branch metric compensation for sequence detection in partial response channels in a digital magnetic recording system.

In digital magnetic recording systems, data is recorded in a moving magnetic media layer by a storage, or "write" electrical current-to-magnetic field transducer, or "head", positioned immediately adjacent thereto. The data is stored or written to the magnetic media along one or another of selected paths therein by switching the direction of flow of a substantially constant magnitude write current which flows through windings in the write transducer. Each write current direction transition results in a reversal of the magnetization direction in that portion of the magnetic media just passing by the transducer during current flow in the new direction, with respect to the magnetization direction in the media induced by the previous current flow in the opposite direction. In one scheme, a magnetization direction reversal over a path portion of the media moving past the transducer represents a binary digit "1" and the lack of any reversal in that path portion represents a binary digit "0".

When data is to be recovered, a retrieval, or "read" magnetic field- to-voltage transducer, (which may be the same as the write transducer if both are inductive) is positioned to have the magnetic media, containing previously stored data, pass thereby such that flux reversal regions in that media either induce, or change a circuit parameter to provide a voltage pulse to form an output read signal for that transducer. In the scheme described above, each such voltage pulse due to the occurrence of a magnetization direction change in corresponding successive media path portions represents a binary digit "1" and the absence of a pulse in correspondence with no such change between successive path portions represents a binary digit "0".

In digital magnetic recording systems using peak detection of such voltage pulses as the data recovery method to digitize the read signal, the times between voltage pulses are used to reconstruct the timing information used in recording the corresponding data previously stored in the magnetic media to define the path portions described above. More specifically, the output of such a peak detector is used as an input signal to a phase-locked loop forming a controlled oscillator, or phase-lock oscillator (PLO), or synchronizer, which produces an output clock signal from the positions of the detected peaks of the read signal. Absolute time is not used in operating the data retrieval system since the speed of the magnetic media varies over time which results in non-uniform time intervals between read signal voltage pulses.

A data encoding scheme known as run-length-limited (RLL) coding is commonly used to improve the PLO's reconstructed clock signal accuracy based on avoiding drift in the frequency thereof because of too much time between voltage read signal pulses. When RLL code is employed, the time durations between read signal voltage pulse transitions is bounded, that is, the number of binary digits of value "0" that can separate binary digits of value "1" in the read signal is limited. This constraint is known overall as a (d, k) constraint where the individual constraint "d" represents the minimum run length of zeros, or the number thereof between ones, while the individual constraint "k" represents the maximum run length of zeros permitted. The "d" portion of the constraint can be chosen so as to avoid crowding of voltage pulses in the read signals which can reduce intersymbol interference problems in which portions of read signal voltage pulses overlap. By limiting the number of consecutive zeros, the "k" constraint maintains the reliability of the PLO in providing an accurate clock signal for the retrieval system. An automatic gain control (AGC) system is used to maintain signal amplitude for the PR4 channel, and the "k" restraint also maintains the reliability of the AGC.

In digital magnetic recording systems employing partial response (PR) signaling, which involves the acceptance of intersymbol interference, data recovery is achieved by periodically sampling the amplitude of the read transducer output signal, as initiated by clock pulses of the PLO, to digitize that signal. In this scheme, each clock pulse of the PLO initiates a sample which has a value contributed to it by more than one pulse in the transducer read signal. Accordingly, a partial response detection system for a PR channel is designed to accommodate the effects of such intersymbol interference, and therefore the "d" constraint may not be necessary (i.e. d=0). The "k" constraint is still necessary in PR signalling because the PLO is still used to provide timing for sampling the read signal, and because the AGC is used to maintain sample amplitude in connection with the PR channel.

A Class 4 PR channel, which is typically the selected frequency response chosen for the signal channel through which the read signal passes prior to detection thereof, is particularly suitable for magnetic recording with typical pulse characteristics because the channel requires very little equalization to achieve an overall match of this Class 4 response. In a Class 4 PR channel for typical pulse characteristics, signal samples are independent of their immediately neighboring samples, but are dependent on samples 2 clock samples away. The read samples are submitted to a Viterbi detector which generates the data that most likely produces the sample values. More particularly, the clock captures digital sample values using an analog-to-digital converter (ADC) where each sample value may be the summing result of more than one pulse read from the magnetic media. These samples are transformed by signal processing techniques to match certain target values. It is based on these transformed samples that the Viterbi detector or other sequence detector recovers the data.

Once a particular signalling scheme is chosen, the structure of the Viterbi detector is configured according to a state diagram for the signalling scheme. A state diagram in the form of a trellis is particularly suitable for a Viterbi detector since it incorporates the time element. An output/input relation is associated with each branch of the trellis. The target value based on an input for a particular branch of the trellis is known as the metric for that branch. A two state Viterbi decoder fits each of the time indexed sample values at the channel output with two allowable channel output sequences. One allowable output sequence minimizes the sum of squared errors over all possible noiseless output sequences ending in a first state of the trellis at time k. The other allowable output sequence minimizes the sum of squared errors over all possible noiseless output sequences ending in a second state of the trellis at time k. The Viterbi detector keeps track of the minimum cumulative branch metric for each state through the trellis over a predetermined time period for determining the path which best fits the sample data to the target values. A complete description of partial response channels, coding techniques and Viterbi detection is available, for example, in "Modulation and Coding for Information Storage" by Paul Siegel and Jack Wolf, *IEEE Communications Magazine*, December 1991, at pages 68–86.

As mentioned above, partial response signalling is to equalize a voltage pulse read from the magnetic media to a certain target value and apply linear superposition to a combination of pulses in order to record more in a given area on the magnetic disc. Each target value of the read back signal from the disc is the linear sum of pulses considered in the signalling scheme. However, one of the problems in high density recording, such as in a partial response signaling, is that the read back waveform is not merely the linear sum of pulses. A magnetic transition on the media may be nonlinearly effected by adjacent transitions in both the write and the read processes so that the read back waveform is distorted. Since the amplitude and location of a read back pulse may be nonlinearly distorted by any nearby magnetic transitions, it is desirable to provide a detection scheme which takes into account and corrects for such magnetic distortions.

SUMMARY OF THE INVENTION

The present invention provides a sequence detection scheme which takes into account amplitude and/or time and/or other magnetic distortions caused by neighboring magnetization regions on the magnetic medium, wherein the distortions in one magnetization region are caused by the closeness of neighboring magnetization transitions on one or both sides thereof. The detection scheme according to the present invention provides an extended state diagram to include the effects of leading (past) and/or trailing (future) magnetization transitions. More particularly, it has been found that accounting for the effects of trailing transitions requires an increase in the number of states in the state diagram used to form the Viterbi detector. Leading transitions are neutralized by increasing the number of branches between states in the Viterbi detector. Increasing the number of branches instead of states keeps the complexity low and thus saves hardware and associated costs.

According to one embodiment, the data sequence detector according to the present invention is employed for a Class 4 partial response channel for use in a digital magnetic recording and read-back system. In such a system the sequence detector recovers an estimated sequence of bits of binary data $[a_1, \ldots, a_k, \ldots, a_n]$ which most likely corresponds to an original sequence of bits of binary data $[A_1, \ldots, A_k, \ldots, A_n]$. The original sequence is precoded into a write sequence of bits of binary data $[B_1, \ldots, B_k, \ldots, B_n]$ which are represented by magnetization regions on a magnetic medium. The estimated sequence of bits of binary data is recovered from a waveform read back from the magnetic medium and transformed into a digital waveform $[X_1, \ldots, X_k, \ldots, X_n]$.

To account for the amplitude and/or time distortions in one magnetization region which are caused by the closeness of neighboring magnetization transitions, the data sequence detector is configured according to a predetermined trellis model having eight (8) current states identified by bits ($B_{k-2}$, $B_{k-1}$, $B_k$) of the write sequence, eight (8) next states identified by bits ($B_{k-1}$, $B_k$, $B_{k+1}$) of the write sequence, at least two (2) branches diverging from each current state, at least two (2) branches merging into each next state, a target value $Y_k$ for each branch of the trellis for use in a branch metric calculation for selecting one of a pair of the branches, and at least two (2) bits of the estimated sequence associated as an output for each state of the trellis.

To account for the amplitude and/or time distortions in one magnetization region which are caused by the closeness of neighboring magnetization transitions, the data sequence detector is configured according to a predetermined trellis model as mentioned above, modified such that there is provided four (4) branches diverging from each current state, four (4) branches merging into each next state, an additional bit $B_{k-3}$ of the write sequence identifying one of a pair of the four branches, and three (3) bits of the estimated sequence associated as an output for each state.

BRIEF DESCRIPTION OF THE DRAWINGS

FIG. 2A is a predetermined state transition diagram in table form for use in a Viterbi detector in a Class 4 partial response channel with a $1-D^2$ precoder as known in the prior art.

FIG. 3A is a predetermined state transition diagram in table form for use in a Viterbi detector in a Class 4 partial response channel with a $1-D^2$ precoder, in accordance with the principles of the present invention.

FIGS. 4A–4D are a predetermined state transition diagram in table form for use in a Viterbi detector in a Class 4 partial response channel with a $1-D^2$ precoder, in accordance with the principles of the present invention.

DETAILED DESCRIPTION OF THE PREFERRED EMBODIMENTS

Overview

Figure 1A:
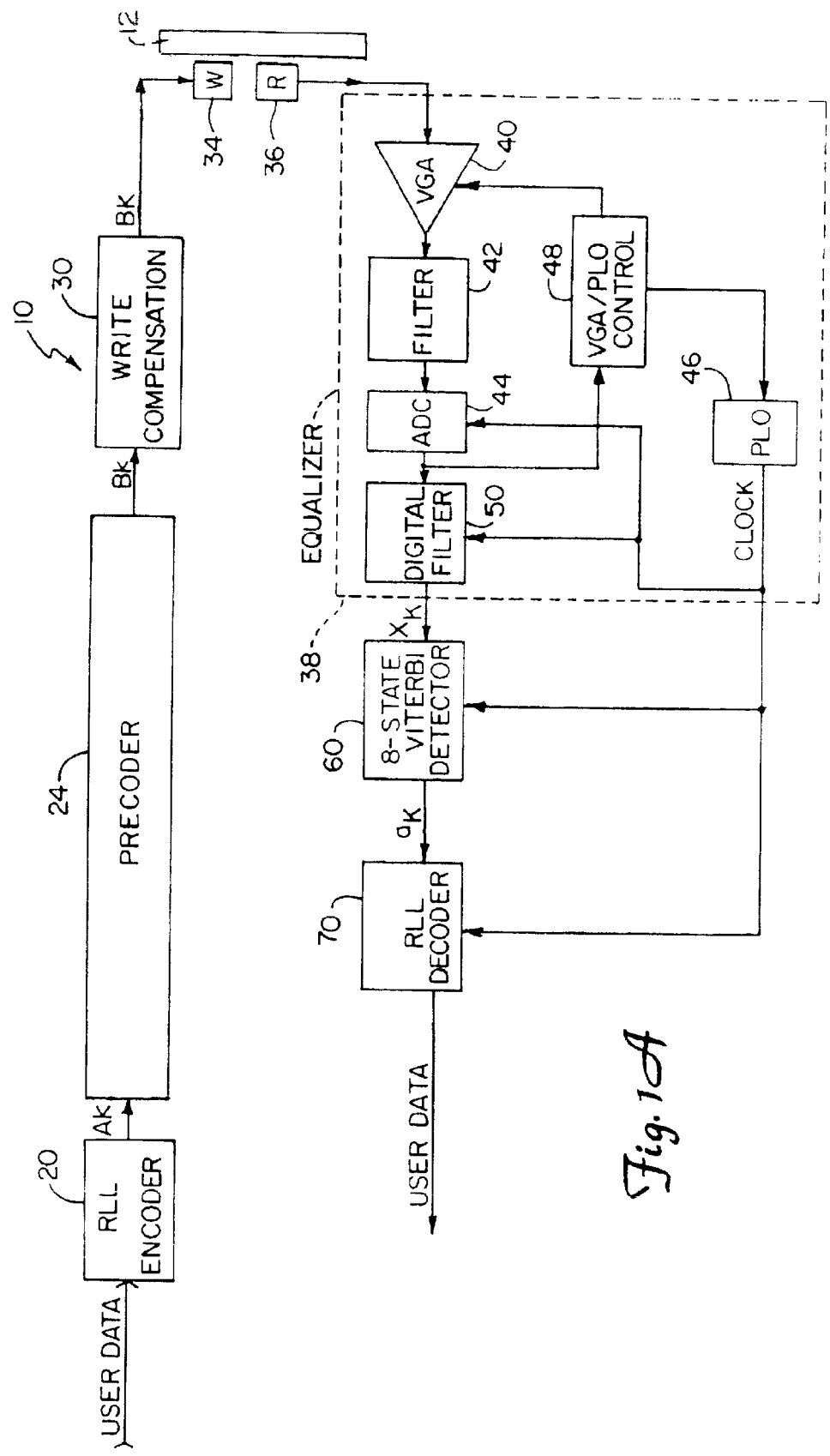
FIG. 1A is a block diagram of a digital magnetic recording system employing a Viterbi detector.

FIG. 1A is a block diagram of a magnetic recording storage and retrieval system which is generally indicated at 10. The magnetic storage and retrieval system 10 includes a magnetic disc media 12 for storing user data in the form of a sequence of binary data bits, write operation circuitry for writing the sequence of binary data bits to the magnetic disc media 12, and read operation circuitry for reading back the sequence of binary data bits from the magnetic disc media 12.

The Write Operation

The write operation circuitry includes a run-length-limited (RLL) encoder 20, a precoder 24, a write compensation circuit 30, and a write transducer 34. For the write operation, incoming user data in the form of binary data bits is input into the RLL encoder 20. The output of the RLL encoder 20 is input into the precoder 24. The output of the precoder 24 is connected to the write compensation circuit 30. The output of the write compensation 30 then drives the write transducer 34 for writing data onto the magnetic disc media 12.

More particularly, the encoder 20 performs a one-to-one mapping of the unconstrained user data sequence to a constrained sequence, denoted $[A_1, \ldots, A_k, \ldots, A_n]$. In other words, the output of the encoder 20 is a binary data sequence which has the number of consecutive binary digits "0" bounded so that the sequence $[A_1, \ldots, A_k, \ldots, A_n]$ satisfies the (d, k) constraints mentioned above. The (d, k)

constraints guarantee that the time duration between pulses of the waveform read back from the magnetic disc media 12 is limited so that the phase lock loop (PLO) maintains the clock accuracy and so that the automatic gain control (AGC) keeps the signal amplitude stable for the data retrieval (read) operation.

The sequence $[A_1, \ldots, A_k, \ldots, A_n]$ is then passed through the precoder 24 which generates a write waveform sequence $[B_1, \ldots, B_k, \ldots, B_n]$ which has a simple and direct mathematical relation to the sequence $[A_1, \ldots, A_k, \ldots, A_n]$. The write sequence $[B_1, \ldots, B_k, \ldots, B_n]$ provides a two-level write current which means that transition sequences of "01" or "10" in adjacent $B_k$ cause the write current to reverse direction. The exact timing of reversals of the write current is further modified by the write-compensation circuit 30 in order to shape the pulses read back from the magnetic disc media 12 to occur at a time which better fits the particular detection scheme being employed. The write compensation circuit 30 uses delay elements to adjust the reversal time of the write current depending on how far away the previous and upcoming transitions are with respect to each other, as is well known to those skilled in the art. Write current from the compensation circuit 30 then flows to an inductive coil winding of the write head transducer 34 to magnetize the magnetic media 12 accordingly.

The Read Operation

The read operation circuitry includes a read transducer 36 (which may be the same as the write transducer 34 if both are inductive), an equalizer circuit 38, a Viterbi detector 60, and an RLL decoder 70. The read transducer 36 is connected to the equalizer circuit 38. The output of the equalizer circuit 38 is input into the Viterbi Detector 60. The output of the Viterbi detector 60 is then input into the RLL decoder 70 for returning the user data.

The equalizer 38 includes a voltage gain amplifier (VGA) 40, an analog filter 42, an analog-to-digital converter (ADC) 44, a phase lock loop (PLO) 46, a VGA/PLO control 48, and a digital filter 50. The output of the read transducer 36 is connected to the input of the VGA 40. The output of the VGA 40 is connected to the input of the analog filter 42. The output of the analog filter 42 is connected to the input of the ADC 44. The output of the ADC 44 is connected to the input of the digital filter 50. The output of the digital filter 50 is then connected to the input of the Viterbi detector 60. The input of the VGA/PLO control 48 is taken from the output of the ADC 44. The output of the VGA/PLO control 48 controls the VGA 40 and the PLO 46. The output of the PLO 46 clocks the ADC 44, digital filter 50, Viterbi detector 60, and RLL decoder 70.

The read or data retrieval operation begins with the read head transducer 36 producing a voltage pulse signal. The voltage pulse signal is induced in the read head transducer 36 by the magnetic flux on the magnetic disc media 12 which results from transition regions on the magnetic media 12. The equalizer circuit 38 equalizes the voltage signal to suit it to a Class 4 partial response channel. The voltage signal is then regulated by the voltage gain amplifier (VGA) 40 which maintains the amplitude of the read back signal. The analog filter 42 then removes high frequency noise from the read back signal. The filtered analog signal is converted into a digital value by the ADC 44 which is latched at the rising edge of a read clock signal. These digital sample values in turn control the VGA/PLO control 48 and the PLO 46 which generates the read clock signal accordingly.

The equalization of the read back waveform is well known to those skilled in the art. The digital sample values from the ADC 44 are shifted into the digital filter 50 which is configured in the form of a transversal filter. In the transversal digital filter 50, each digital sample from the ADC 44 is summed with a preceding sample which has been weighted and a trailing sample which has been weighted. The weights in the digital filter 50 are designed to transform the digital samples of the read back sequence to match certain target values within the detection scheme. The output sample values of the digital filter 50, denoted $[X_1, \ldots, X_k, \ldots, X_n]$, are then shifted into the Viterbi detector 60 for detection of a sequence $[a_1, \ldots, a_k, \ldots, a_n]$ which best fits the read back signal sample values $[X_1, \ldots, X_k, \ldots, X_n]$. The Viterbi detector 60 thereby identifies the original sequence $[A_1, \ldots, A_k, \ldots, A_n]$ with as high a degree of certainty as possible.

The Viterbi detector 60 is modeled from a state transition diagram. In the state diagram a current state at time k (represented by symbols $B_{k-2}$ and $B_{k-1}$ of the write sequence $[B_1, \ldots, B_k, \ldots, B_n]$) and an associated target input. $Y_k$ (used in making comparisons to a sample $X_k$ of the read back signal sample values $[X_1, \ldots, X_k, \ldots, X_n]$), are linked to an output (represented by $a_k$ of the estimated sequence $[a_1, \ldots, a_k, \ldots, a_n]$) and a next state (represented by symbols $B_{k-1}$, and $B_k$ of the write sequence $[B_1, \ldots, B_k, \ldots, B_n]$). The state diagram can be represented in a table or expressed in the form of a trellis diagram to represent operation of the Viterbi detector 60 for determining the most probable state transition for each time period k. The path between a current state and a next state within the trellis is called a branch. Each branch has associated therewith the target input value $Y_k$ for the corresponding on of the read back sample values $[X_1, \ldots, X_k, \ldots, X_n]$. Along each branch of the trellis, a sample value $X_k$ of the read back sequence is compared to the metric target value $Y_k$ for that branch. This comparison is repeated for all branches merging into a next state for a given time period k. The trellis branch having the minimum sum of the square of the difference between each $X_k$ and $Y_k$, i.e. $(X_k - Y_k)^2$ as the branch metric plus the cumulative sum of the error squared of the state from which the branch emerged, thereby measuring the "closeness" of the sample $X_k$ to the branch metric target value $Y_k$, is determined to be a winner (survivor) at time period k. By using the minimum cumulative metric sum of the concatenating branches leading to each state for each time k, the Viterbi detector 60 maps a surviving path through the trellis. This surviving path yields the data sequence $[a_1, \ldots, a_k, \ldots, a_n]$ that best matches with the filtered read back sample values $[X_1, \ldots, X_k, \ldots, X_n]$. In other words, the Viterbi detector 60 finds an estimated sequence $[a_1, \ldots, a_k, \ldots, a_n]$ which most likely produced the read-sampled sequence $[X_1, \ldots, X_k, \ldots, X_n]$ and which therefore is the best possible representation of the original sequence $[A_1, \ldots, A_k, \ldots, A_n]$ based on available information.

The estimated sequence $[a_1, \ldots, a_k, \ldots, a_n]$ is then shifted into the RLL decoder 70 which performs a reverse mapping of the RLL sequence to recover the user data, as is well known to those skilled in the art.

According to the present invention, the state diagram used to construct the Viterbi detector 60 is now extended to map through the trellis structure a leading (past) voltage pulse transition of the read back waveform sample values $[X_1, \ldots, X_k, \ldots, X_n]$ and a trailing (future) voltage pulse transition of the read back waveform sample values $[X_1, \ldots, X_k, \ldots, X_n]$. The present invention thereby increases the choices of $Y_k$ according to different pattern cases. In other words, instead of keeping track of only one (1) state transition of the read back waveform sample values $[X_1, \ldots, X_k, \ldots, X_n]$ at a time through the Viterbi detector 60, the present invention provides for also following a leading pulse transition and a trailing pulse transition. By looking at these additional samples the Viterbi detector 60 is able to make a better match to each sample $X_k$ of the read back waveform sample values $[X_1, \ldots, X_k, \ldots, X_n]$. The additional branches and their corresponding branch metrics more accurately represent the read back waveform by neutralizing the distortion in the time and amplitude for each voltage pulse transition which is caused by nonlinear magnetic interaction of a leading or trailing pulse to the portion of the read back waveform being mapped in the trellis. A Class 4 partial response (PR4) channel is used as an example to illustrate the branch metric compensation contemplated by the present invention. Nevertheless, this branch metric compensation method is applicable to other classes of partial response and adaptable to other types of sequence detection.

Prior Art Viterbi Detector

Figure 1B:
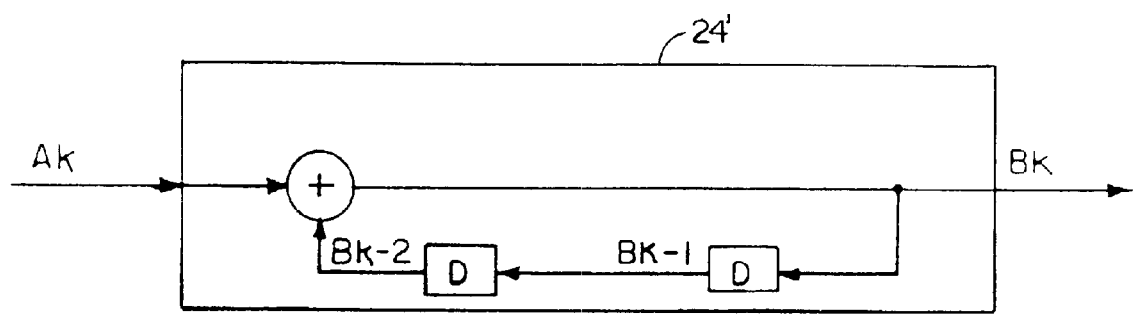
FIG. 1B is a block diagram of a prior art precoder for use in the block diagram of FIG. 1A.
Figure 2B:
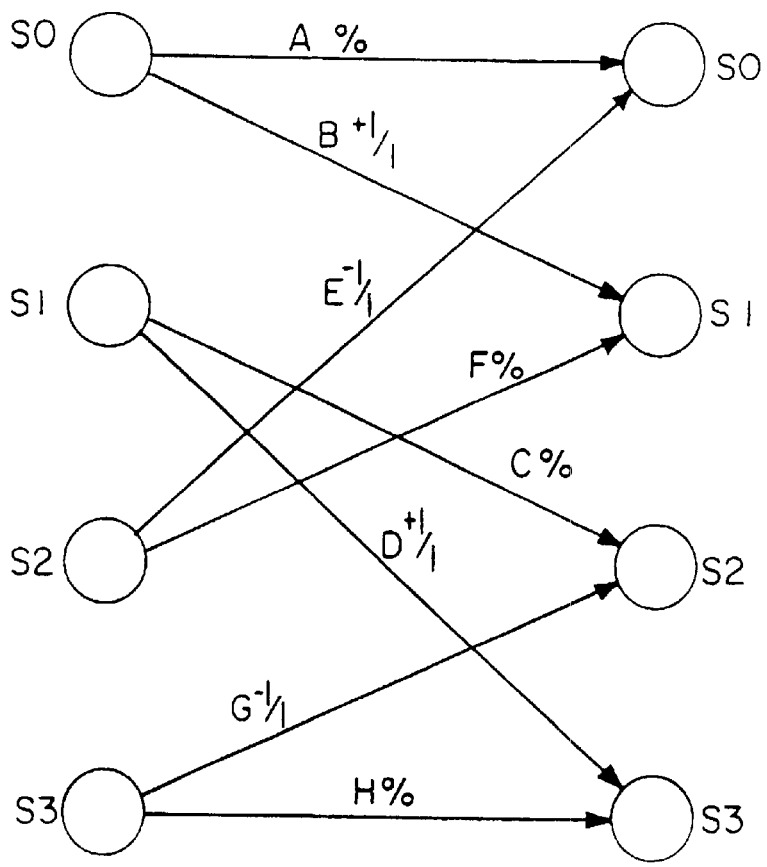
FIG. 2B is a trellis diagram of the state transition table of FIG. 2A.

Before looking at the branch metric compensation for the leading transition pulse and trailing transition pulse, it is helpful to look at the prior art state transition table and trellis for a PR4 channel as shown in FIGS. 2A and 2B. The PR4 channel is also known as a $(1-D^2)$ channel since it is described by the partial response polynomial $1-D^2$. The factor $D^i$ signifies a delay of "i" sample-clock time units between bits of the write sequence $[B_1, \ldots, B_k, \ldots, B_n]$. FIG. 1B shows the precoder 24' for such a system. The precoder 24' translates each bit $A_k$ of the original binary sequence $(A_1, \ldots, A_k, \ldots, A_n)$ into a corresponding bit $B_k$ of the write sequence $[B_1, \ldots, B_k, \ldots, B_n]$, where:

$$A_k = (B_{k-2}) \text{ XOR } (B_k). \qquad [1.a]$$

For purposes of encoding and decoding the write sequence $[B_1, \ldots, B_k, \ldots, B_n]$, each $B_k$ is expressed as follows:

$$B_k = (B_{k-2}) \text{ XOR } (A_k). \qquad [1.b]$$

Thus, in the prior art precoder 24' for a PR4 channel there are only two delayed versions of $B_k$ which are denoted $B_{k-1}$ and $B_k$, which are delayed versions of $B_k$ by one and two clock periods, respectively. The content of registers $B_{k-2}$ and $B_{k-1}$ changes at each clock cycle and thus represents the current state of the cycle. Accordingly, there are four (4) possible values for the current state represented by bits "$B_{k-2}B_{k-1}$". These possible values are "00", "01", "10" and "11" and they are represented in FIGS. 2A and 2B by the four (4) states S0, S1, S2, S3, respectively. The next state for each current state is represented by the bits "$B_{k-1}B_k$" which are again represented by the same four states S0, S1, S2 and S3. In other words, a current boundary region on the magnetic media is represented as being between bits $B_{k-2}$ and $B_{k-1}$ and the next boundary region on the magnetic media is represented as being between bits $B_{k-1}$ and $B_k$. The target value $Y_k$ for each input of $X_k$ (which is then related to $A_k$ by equation [1.a]) is obtained by applying the polynomial $1-D^2$ to $B_k$, so that:

$$Y_k = B_k - B_{k-2}. \qquad [2]$$

FIG. 2A shows a list of all possible $B_k$ sequences for three consecutive time periods, a current state, a next state, a target value $Y_k$, the corresponding input value $A_k$, and a branch A–H. The list of all possible $B_k$ sequences is denoted in columns $B_{k-2}$, $B_k$, and $B_k$ and each sequence is designated by one of the branches A–H. In addition, for each possible $B_{k-2}B_{k-1}B_k$ sequence the current state is designated S0–S3 (where each state is represented by bits "$B_{k-2}B_{k-1}$") and the next state is designated S0–S3 (where each state is represented by bits "$B_kB_k$"). The next state and output are determined by branch metric calculations based upon the list of all possible inputs of $A_k$ for each state and their corresponding target values $Y_k$ as mentioned above. In FIG. 2A, $Y_k$ is associated with two transitions: "$B_{k-2} \ B_{k-1}$" and $B_{k-1} \ B_k$.

FIG. 2B shows the table of FIG. 2A in trellis form, wherein the expression for the metric and output relationship of each branch (A–H) is $Y_k/A_k$. There are two branches diverging from each current state and two branches merging at each next state. The fact that there are only two merging branches per state means that each state will only have to compare two metric sums and select one survivor at each clock cycle. FIGS. 2A and 2B represent the well known state diagram and trellis used in a prior art Viterbi detector for a PR4 channel.

Viterbi Detector Accounting for Effect of Trailing Transition Pulse

To account for the effect of the trailing (future) transition pulse according to the present invention, it is necessary to consider the transition between bits $B_k$ and $B_{k+1}$ (using the scheme discussed above with regard to FIGS. 2A and 2B) for the entire write sequence $[B_1, \ldots, B_k, \ldots, B_n]$. Accordingly, as shown in FIG. 3A, new columns $A_{k+1}$ and $B_{k+1}$ are added to the state transition table where:

$$B_{k+1} = (B_{k-1}) \text{ XOR } (A_{k+1}) \qquad [3.a]$$

or:

$$A_{k+1} = (B_{k-1}) \text{ XOR } (B_{k+1}) \qquad [3.b]$$

To keep the number of diverging or merging branches at two per state, the number of states is doubled from four (S0–S3) in FIG. 2A to eight (S0–S7) in FIG. 3A. The current state is represented by the three binary digits "$B_{k-2}B_{k-1}B_k$" and the next state is represented by the three binary digits "$B_{k-1}B_kB_{k+1}$". In this embodiment the precoder 24 (see FIG. 1B) is used to provide $B_{k-2}$ and $B_{k-1}$ as described above.

Figure 3B:
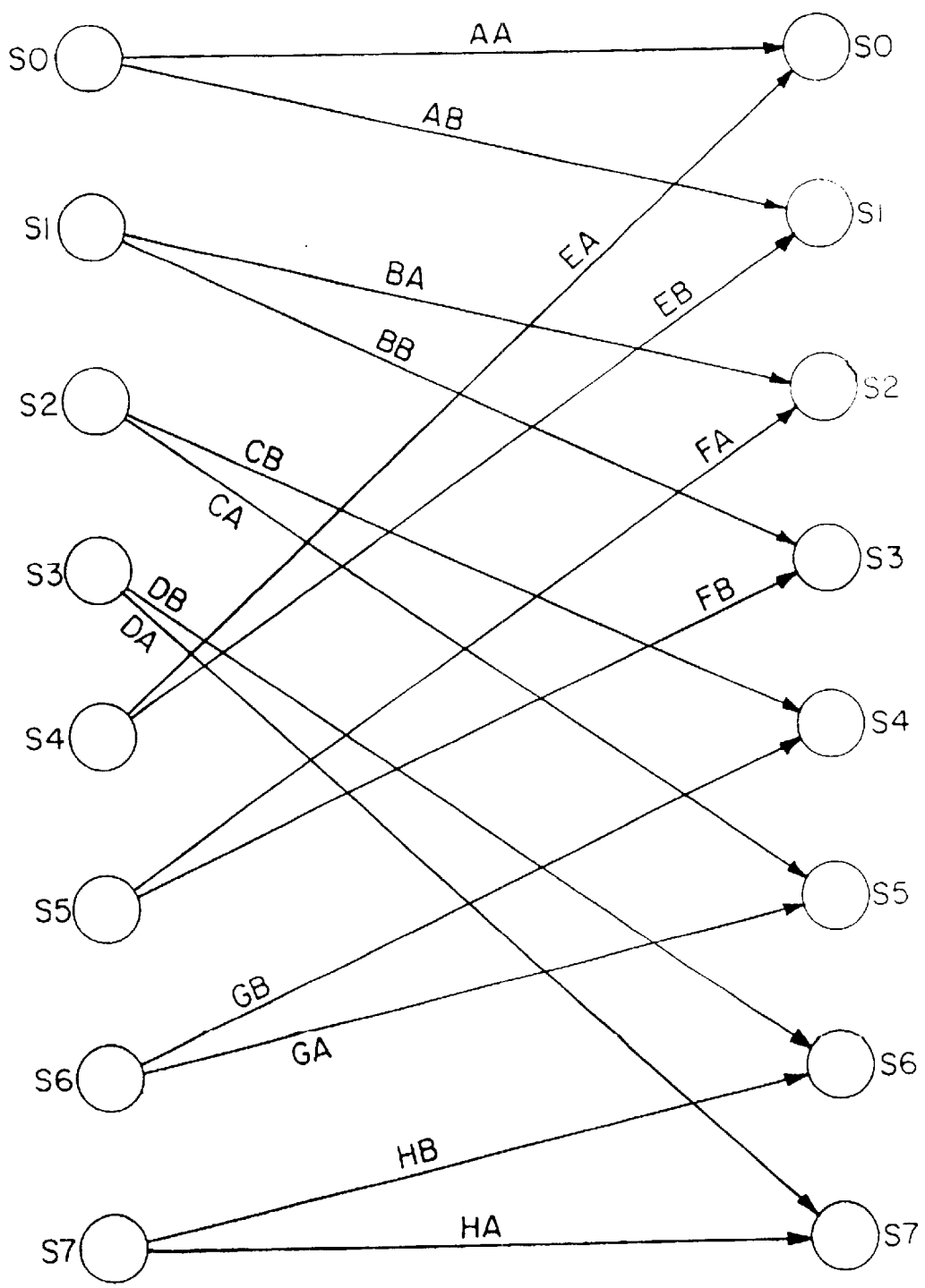
FIG. 3B is a trellis diagram of the state transition table of FIG. 3A.

Referring to FIGS. 3A and 3B, at each clock cycle a state must select a merging branch that yields the minimum cumulative metric sum for the next state. Limiting the merging branches to two (2) per state helps maintain the branch selection time to within one cycle. Assuming linear superposition of the pulses, the $Y_k$ column is again obtained by applying equation [2] above. As the number of states (S0–S7) is doubled, the total number of branches (AA–HA) is also doubled, when compared to the prior art state diagram shown in FIGS. 2A and 2B. In this arrangement, $Y_k$ is associated with three transitions: "$B_{k-2} \ B_{k-1}$", $B_{k-1}, B_k$", $B_k \ B_{k+1}$". In an ideal environment where there is no distortion, the possible noiseless values of $Y_k$ are $-1, 0, +1$ as shown in the Figures. By choosing the appropriate statistical average of actual measured values of $Y_k$ for each branch, the non-linear distortion of the pulses can be corrected. Thus, the state transition and trellis in FIGS. 3A and 3B provide a scheme for a more accurate and improved Viterbi detector 60 compared to that in FIGS. 2A and 2B, because the effects of a possible trailing transition pulse on the current transition region is now considered.

Viterbi Detector Accounting For Effect of Leading Transition Pulse

To account for the effect of the leading (past) transition pulse according to the present invention, it is necessary to consider the transition between bits $B_{k-3}$ and $B_{k-2}$ (using the scheme discussed above with regard to FIGS. 2A, 2B, 3A and 3B) for the entire write sequence $[B_1, \ldots, B_k, \ldots, B_n]$. Accordingly, as shown in FIGS. 4A–4D, new columns $A_{k-1}$ and $B_{k-3}$ are added to the state transition table shown in FIG. 3A, where:

$$B_{k-3} = (B_{k-1}) \text{ XOR } (A_{k-1}). \quad [4.a]$$

or:

$$A_{k-1} = (B_{k-1}) \text{ XOR } (B_{k-3}). \quad [4.b]$$

Figure 4E:
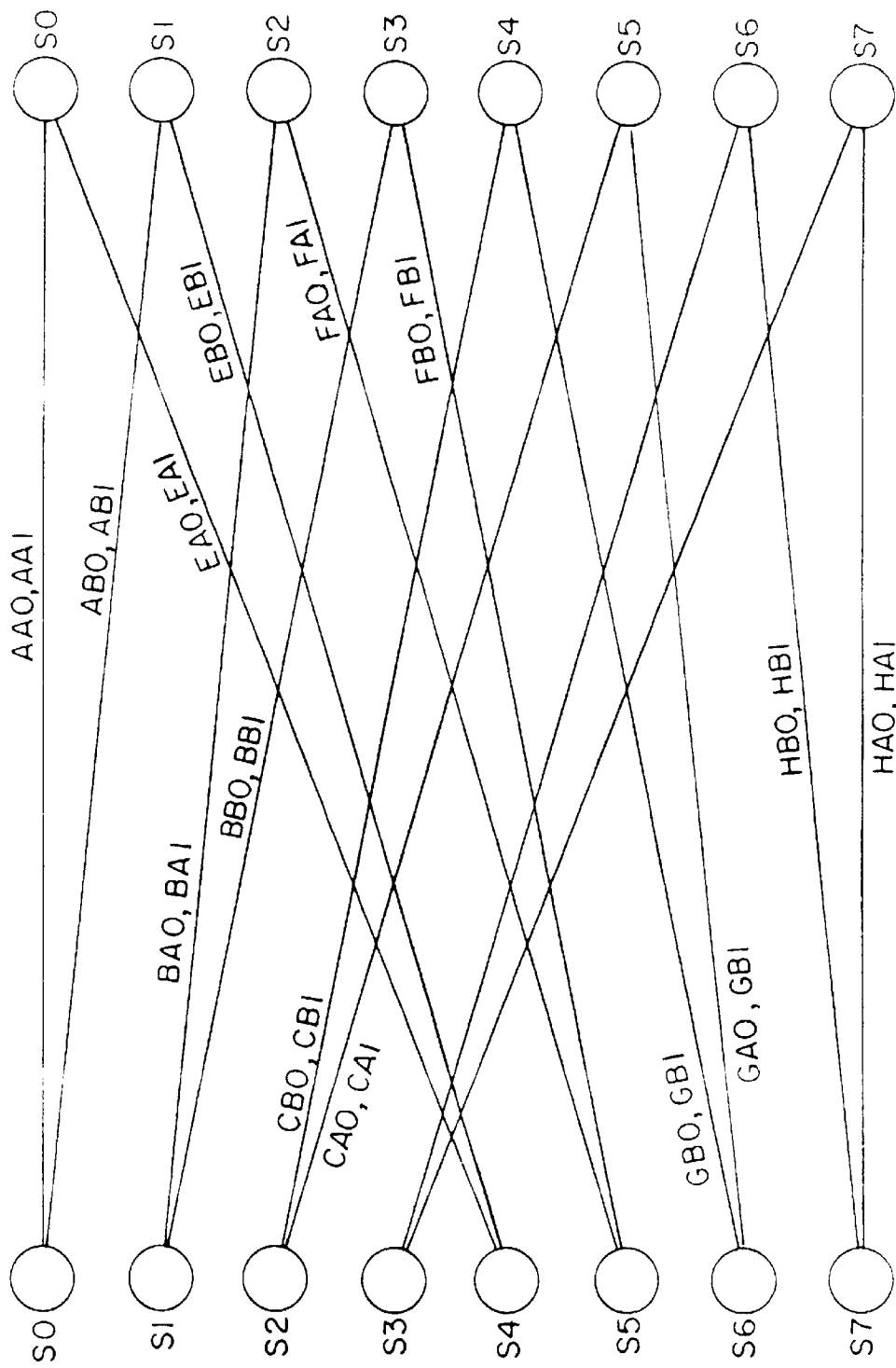
FIG. 4E is a trellis diagram of the state transition table of FIGS. 4A–4D.

FIG. 4E shows the state diagram in trellis form for the table in FIGS. 4A–4D. While it would seem logical that an additional 8 states are necessary to track the addition of the leading transition pulse, the number of states is kept at eight (8), as in FIGS. 3A and 3B, while the number of merging branches to each state is increased. This is made possible because the branch metrics associated with the leading (past) transition pulse have already been measured at an earlier time period. The sample precoder 24 is used here but the state diagram has to consider three (3) delayed versions of $B_k$ which are denoted $B_{k-1}$, $B_{k-2}$, and $B_{k-3}$ which are delayed versions of $B_k$ by one, two and three clock periods, respectively.

Even more, while the number of merging branches is now apparently increased to four (4) per state, branches between any two particular states are in two pairs and the selection process for each pair is further simplified according to the present invention. Information bit $A_{k-1}$ reflects the previous selected output for each state as determined at the previous clock cycle. Since the information the bit corresponding to $A_{k-1}$, has already been determined, it is possible to determine whether Branch "0" or Branch "1" should be used in determining the minimum cumulative branch metric for each of the two branch pairs between any two states. More particularly, it is noted that in the last column of the table in FIGS. 4A–4D, a Branch having a label ending in '--0' corresponds to "$A_{k-1}=0$" and a Branch having label ending in '--1' corresponds to "$A_{k-1}=1$". Therefore, for a branch pair going from state "m" to state "n", the bit corresponding to $A_{k-1}$ of state 'm' is used as a select signal to determine which of the two branches (metrics) should be used. This shortcut technique essentially keeps the compare and select process within the Viterbi detector 60 at two branches per state and preserves the process time.

The $Y_k$ column in FIGS. 4A–4D is again the linear superposition of $(B_k - B_{k-2})$ as indicated in equation [2] above. In this arrangement. $Y_k$ is associated with four transitions: "$B_{k-3}$ $B_{k-2}$", $B_{k-2}$ $B_{k-1}$", $B_{k-1}$ $B_{k-1}$", and $B_k$ $B_{k+1}$". In recording systems where the read back pulses interact nonlinearly, the resultant read sample values $[X_1, \ldots, X_k, \ldots, X_n]$ will deviate from the $Y_k$ targets. To find the suitable target values for such a recording system, a predetermined pseudo random pattern including all possible branches is written to the magnetic media 12. Samples are taken and a statistical average for each $Y_k$ is determined for each branch. These new target values are then used in the Viterbi detector 60 as described above.

In sum, by utilizing a state transition table which takes into account the adjacent leading and/or trailing transition regions about the current magnetization region, the Viterbi detector 60 accounts for and remedies the nonlinear distortion in amplitude and/or time which occurs on the magnetic media 12. A significant improvement in the error rate has been observed (approximately 2 orders of magnitude) in a test system employing the present invention as described above. It is to be understood that the branch metric compensation method presented here is a general procedure. The method can be applied to other popular signaling schemes such as the extended PR4 systems that have partial response polynomials of the form $(1-D)(1+D)^n$, where "n" is a positive integer greater than 1. It should also be noted that, in practice, the full-blown state diagram of branch metric compensation can usually be simplified. For example, some branch pairs may show very small differences so that they may be considered as one single branch. Such simplifications are generally system and channel dependent so they should be implemented according to the individual situation.

Although the present invention has been described with reference to preferred embodiments, workers skilled in the art will recognize that changes may be made in form and detail without departing from the spirit and scope of the invention.

What is claimed is:

1. A data sequence detector for use in a digital magnetic recording and read-back system for obtaining an estimated sequence of bits of binary data corresponding to an original sequence of bits of binary data, wherein the original sequence is selectively precoded into a write sequence of bits of binary data which are represented by corresponding magnetization regions in a magnetic medium; the detector comprising:

an input for receiving a data waveform obtained at least in part from magnetization regions in the magnetic medium;

circuitry configured according to a predetermined state machine model having at least 8 states; and wherein the circuitry is configured to perform steps of:

(a) recovering the estimated sequence from the data waveform;

(b) converting the estimated sequence of bits of binary data into a waveform sequence of sample values;

(c) performing data waveform based magnitude determinations using at least four values from the waveform sequence wherein possible distortions of the data waveform are caused at least in part by the data waveform being obtained from primary corresponding magnetization regions and an adjacent magnetization region in the magnetic medium, wherein the at least four sample values used in magnitude determinations include a trailing sample value which follows sample values corresponding to the primary magnetization regions, and a leading sample value which precedes sample values corresponding to the primary magnetization regions; and (d) compensating possible distortions of some of these waveform sequence values by use of detection criteria based on corresponding combinations of sample values from the waveform sequence for at least some subsequences of three sample values from the waveform sequence which detection criteria differ from the distortion free detection criteria which would otherwise be used based on a corresponding combination of fewer sample values from the waveform sequence.

2. The data sequence detector of claim 1 utilizing a Class 4 partial response channel having a $1-D^2$ partial response polynomial to obtain the waveform sequence from the data waveform based on the write sequence of bits of binary data such that a branch metric, M, is determined by $M = (X_k - Y_k)^2$, wherein $Y_k = B_k - B_{k-2}$ provides the ideal detection criteria.

3. The data sequence detector of claim 1, wherein the number of states is 8.

4. The data sequence detector of claim 3, wherein each state has associated therewith four diverging branches leading therefrom to next states, and four merging branches leading thereto from previous states with respect to which a cumulative minimum branch metric is determined.

5. The data sequence detector of claim 1, configured according to a predetermined state machine model having at least two (2) branches leading to states and at least two (2) branches leading from states which provide a basis for the different detection criteria used due to the amplitude and/or time distortion of the data waveform obtained from a magnetization region corresponding to a current sample value and the adjacent preceding magnetization region in the magnetic medium.

6. The data sequence detector of claim 5, wherein the number of states is 8 and the number of branches is 4 per state.

7. The data sequence detector of claim 1, wherein the detector is an improved Viterbi-type sequence detector for obtaining data values from sample values of a recovered data waveform configured according to a predetermined state machine model having a number of states provided because of distortions in a recovered data waveform obtained at least in part from corresponding adjacent magnetization regions in a magnetic medium to thereby permit use of detection criteria in data waveform based magnitude determinations in connection with which differing distortion free detection criteria would otherwise be used in a predetermined state machine model of fewer states receiving the same sample values.

8. The improved Viterbi-type sequence detector of claim 7, wherein the predetermined state machine model further has a number of branches leading to and from states therein, and the different detection criteria for a portion of the data waveform obtained primarily from corresponding magnetization regions are based at least in part on magnetizations of adjacent magnetization regions preceding and following the corresponding magnetization regions.

9. The improved Viterbi-type sequence detector of claim 8, wherein the number of states is 8 and the number of the branches is 4 per state.

10. In a digital magnetic recording and read-back system, a method for obtaining an estimated sequence of bits of binary data corresponding to an original sequence of bits of binary data, wherein the original sequence is selectively precoded into a write sequence of bits of binary data which are represented by magnetization regions on a magnetic medium, the method comprising:

obtaining an analog waveform from the magnetization regions on a magnetic medium;

transforming the analog waveform into a sequence of digital waveform sample values;

passing the digital waveform into a sequence detector, the sequence detector being configured according to a predetermined state machine model using at least four sample values from the sequence of digital waveform sample values, to perform digital waveform based magnitude determinations, wherein possible distortions of the analog waveform are caused in part by the analog waveform being obtained from primary corresponding magnetization regions and an adjacent magnetization region in the magnetic medium, and further where the at least four sample values include a trailing sample value which follows sample values corresponding to the primary magnetization regions, and a leading sample value which precedes sample values corresponding to the primary magnetization regions;

compensating possible distortions of some of these sample values by use of detection criteria based on corresponding combinations of sample values from the digital waveform for at least some subsequences of three sample values; and receiving the estimated sequence from the sequence detector.

11. The method of claim 10, wherein the original sequence of bits of binary data is a run length limited encoded sequence, and wherein the method further comprises the step of decoding the estimated sequence.

12. The method of claim 10, wherein the sample values in a data waveform based magnitude determination include a trailing sample value which follows the sample values corresponding to the primary magnetization regions, and wherein the predetermined state machine model further has a number of branches leading to and from states therein, and different detection criteria are used in digital waveform based magnitude determinations in connection with which substantially the same ideal detection criteria would otherwise be used with the different detection criteria being used for a portion of the digital waveform, obtained primarily from corresponding primary magnetization regions, being based at least in part on magnetizations of adjacent magnetization regions preceding and following the corresponding primary magnetization regions.

13. A data sequence detector for use in a digital magnetic recording and read-back system for obtaining an estimated sequence of bits of binary data corresponding to an original sequence of bits of binary data, wherein the original sequence is selectively precoded into a write sequence of bits of binary data which are represented by corresponding magnetization regions in a magnetic medium, the estimated sequence of bits of binary data being recovered from a waveform obtained at least in part from the magnetization regions in the magnetic medium and transformed into digital waveform sample values, the data sequence detector being configured according to a predetermined trellis model comprising:

eight (8) current states identified by the current and two immediately preceding bits of the write sequence;

eight (8) next states identified by the current, the next and the immediately preceding bits of the write sequence;

at least two (2) branches diverging from each current state;

at least two (2) branches merging into each next state;

a target value $Y_k$ for each branch of the trellis for use in a branch metric calculation for selecting one of a pair of the branches which target values can differ in magnitude even though the ideal target values are substantially equal; and at least two (2) bits of the estimated sequence associated as an output for each state of the trellis.

14. The data sequence detector of claim 13, wherein the trellis model comprises:

four (4) branches diverging from each current state, the four branches being arranged into two pairs;

four (4) branches merging into each next state, the four branches being arranged into two pairs;

an additional bit $B_{k-3}$ of the write sequence identifying one branch of each of the pairs; and three (3) bits of the estimated sequence associated as an output for each state.

15. A data sequence detector for obtaining a sequence of bits of binary data from a data storage medium, wherein the sequence corresponds to an original sequence of bits of binary data written to the data storage medium, wherein the sequence of bits of binary data is based on a waveform obtained from the data storage medium and transformed into a digital waveform, the data sequence detector being configured according to a predetermined trellis model comprising:

eight (8) current states each representing three bits of the sequence;

eight (8) next states each representing three bits of the sequence;

at least two (2) branches diverging from each current state;

at least two (2) branches merging into each next state;

a target value $Y_k$ for each branch of the trellis for use in a branch metric calculation for selecting one of the merging branches which target values can differ in magnitude even though the ideal target values are substantially equal; and at least two (2) bits of the sequence associated as an output for each state of the trellis.

16. The data sequence detector of claim 15, wherein the trellis model comprises:

four (4) branches diverging from each current state, the four branches being arranged into two pairs;

four (4) branches merging into each next state, the four branches being arranged into two pairs; and three (3) bits of the sequence associated as an output for each state.

17. The data sequence detector of claim 16, wherein an additional bit of the sequence is used to identify one branch of each pair of the branches to reduce the number of branch metric calculations.

18. An improved data sequence detector for use in recovering a data sequence from a data storage medium, the data detector being configured according to a predetermined state machine model having a number of states and four merging branches leading to each state, wherein the four merging branches are arranged in pairs, and wherein one branch of each pair is selected based on a previously determined bit of the data sequence.

19. The improved data sequence detector of claim 18, wherein the predetermined state machine model has eight (8) states.

20. The improved data sequence detector of claim 18, wherein the number of states is greater than four (4).

21. The improved data sequence detector of claim 20, wherein there are eight (8) states and four (4) branches merging into each state.

* * * * *